United States Patent
Niigaki et al.

(10) Patent No.: US 7,094,664 B2
(45) Date of Patent: Aug. 22, 2006

(54) METHOD FOR FABRICATING SEMICONDUCTOR PHOTODETECTOR

(75) Inventors: Minoru Niigaki, Hamamatsu (JP); Kazutoshi Nakajima, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 148 days.

(21) Appl. No.: 10/416,199

(22) PCT Filed: Nov. 9, 2001

(86) PCT No.: PCT/JP01/09834

§ 371 (c)(1),
(2), (4) Date: May 8, 2003

(87) PCT Pub. No.: WO02/39506

PCT Pub. Date: May 16, 2002

(65) Prior Publication Data

US 2005/0014321 A1    Jan. 20, 2005

(30) Foreign Application Priority Data

Nov. 10, 2000 (JP) .............................. 2000-343940

(51) Int. Cl.
    *H01L 21/30* (2006.01)

(52) U.S. Cl. ................. 438/455; 438/458; 257/E21.122

(58) Field of Classification Search ............ 438/22–47, 438/455–465, 406; 257/E21.088, E21.122, 257/E21.126, E21.567, E21.568, E21.75, 257/E21.084, E21.085, E21.086

See application file for complete search history.

(56) References Cited

U.S. PATENT DOCUMENTS

| 4,226,649 | A |   | 10/1980 | Davey et al. ............... 148/175 |
| 4,601,779 | A |   | 7/1986  | Abernathey et al. ........ 156/628 |
| 5,330,918 | A |   | 7/1994  | Dubbelday et al. ............ 437/2 |
| 5,525,828 | A |   | 6/1996  | Bassous et al. ............. 257/457 |
| 6,503,778 | B1 | * | 1/2003  | Yamauchi et al. .......... 438/107 |
| 6,586,773 | B1 | * | 7/2003  | Saeki et al. .................... 257/86 |

FOREIGN PATENT DOCUMENTS

| EP | 0 063 422 | 10/1982 |
| JP | 58-200525 | 11/1983 |
| JP | 03-270073 | 12/1991 |

(Continued)

OTHER PUBLICATIONS

P. Fay et al., A Comparative Study of Integrated Photoreceivers Using MSM/HEMT and PIN/HEMT Technologies, IEEE Photonics Technology Letters, vol. 10, No. 4, Apr. 1998, pp. 582-584.

M. Hargis et al., "Hole dominated transport in InGaAs metal semiconductor metal photodetectors," Appl. Phys. Lett. 67(3), Jul. 17, 1995, pp. 413-415.

(Continued)

*Primary Examiner*—Brook Kebede
(74) *Attorney, Agent, or Firm*—Drinker Biddle & Reath LLP (57) ABSTRACT

Multilayer films (2 to 7) containing a light absorption layer (4) are formed on a GaAs substrate. After laminating the GaAs substrate (1) and a glass substrate (8) so that an uppermost surface film (7) of the multilayer film and the glass substrate (8) may come into contact with each other, by pressurizing between the GaAs substrate (1) and the glass substrate (8) and heating them together, both substrates (1) and (8) are fusion-bonded. Next, the GaAs substrate (1) and the buffer layer (2) are first removed, and then the etch stop layer (3) is removed. Then, while coming into contact with the light absorption layer (4), comb-type Schottky electrodes (10) and (11), which are mutually apart, are formed.

3 Claims, 4 Drawing Sheets

FOREIGN PATENT DOCUMENTS

| | | |
|---|---|---|
| JP | 05-259500 | 10/1993 |
| JP | 06-151946 | 5/1994 |
| JP | 09-330940 | 12/1997 |
| JP | 10-270670 | 10/1998 |

OTHER PUBLICATIONS

O. Vendier et al., "Thin-Film Inverted MSM Photodetectors," IEEE Photonics Technology Letters, vol. 8, No. 2, Feb. 1996, pp. 266-268.

* cited by examiner

*Fig. 1A* CRYSTAL GROWTH PROCESS

*Fig. 1B* CVD PROCESS

*Fig. 1C* ADHERING PROCESS

*Fig. 1D* ETCHING PROCESS

*Fig. 1E* ELECTRODE FORMATION PROCESS

METHOD FOR FABRICATING SEMICONDUCTOR PHOTODETECTOR

TECHNICAL FIELD

This invention relates to a method for manufacturing a semiconductor photodetector provided with a light absorption layer where electrons and holes are excited by absorption of incident light.

BACKGROUND ART

In an optical Local Area Network (hereinafter referred to as LAN), light signals are transmitted and received at a transmission speed of several Gb/s (Gigabit per second). However, it is expected that along with increasing amounts of communications information, light signals would have to be transmitted and received at a transmission speed of 10 or more Gb/s in the future. A light detection device used in the present optical LAN mainly employs a PIN photo diode (hereinafter referred to as PIN-PD), and the PIN-PD can respond to a transmission speed of several Gb/s, but cannot sufficiently respond to still higher transmission speeds. Therefore, a photodetector which can operate at a speed still higher than that of the PIN-PD is desired.

DISCLOSURE OF THE INVENTION

Since a response speed of a metal-semiconductor-metal type photo diode (hereinafter referred to as MSM-PD) is faster compared to the PIN-PD and can also sufficiently respond to the transmission speed of 10 or more Gb/s, it is considered to be a photodetector which could make higher speed communications possible.

However, since incident light is shielded or absorbed by a comb-type Schottky electrode formed on a light incident plane, the MSM-PD has a problem of low light detection sensitivity, which prevents application in optical LAN system.

Meanwhile, the MSM-PD which detects infrared light with a wavelength of 1.7 μm is fabricated by using an InP substrate. In the case of this MSM-PD, since light with a wavelength of 1.7 μm may penetrate the InP substrate and reach a light absorption layer, the incident light can avoid being shielded or absorbed by the Schottky electrode by making the light incident from the side of the InP substrate. The method of allowing the light to enter from the side of such substrates is disclosed in, for example, the literature of APPl. Phys. Lett. 67(3), 17 Jul. 1995, PP. 413–415.

However, in the case of the MSM-PD fabricated using a GaAs substrate for detecting light having a wavelength of 850 nm, or near infrared light, if the light is made incident from the side of the GaAs substrate, it is absorbed into the GaAs substrate and cannot reach the light absorption layer. Therefore, light must be made incident from the side of the electrode, whereby the shielding or absorption of the incident light by the electrode is not avoided.

In order to solve these problems, the MSM-PD fabricated using an epitaxial-lift-off method and a method for manufacturing the same are proposed. The light detection element disclosed in Japanese Unexamined Patent Publication No. Hei-6-151946, for example, is formed by peeling off a multilayer film which consists of a light absorption layer, a window layer and the like from a semiconductor substrate by the epitaxial-lift-off method, and adhering this multilayer film onto other substrates. In this case, although the light is made incident from a plane opposite the electrode plane formed on the multilayer film, since the uppermost surface layer of this plane is the window layer, the incident light may reach the light absorption layer, without being absorbed by the window layer. Therefore, improvement in the light detection sensitivity of the MSM-PD can be achieved.

The light detection element disclosed in Japanese Unexamined Patent Publication No. Hei-5-259500, for example, is formed by adhering the multilayer film peeled from the substrate onto the transparent substrate employing a similar method as explained above. Here, the electrode formed on the multilayer film is a plane opposite to an adhesion plane with a transparent substrate, and the light is made incident from the side of the transparent substrate. The incident light therefore may reach the light absorption layer, without being shielded or absorbed by the electrode. Consequently, the light detection sensitivity of the MSM-PD is improved.

However, when fabricating the MSM-PD in this manner, the following problems are encountered. That is, since the multilayer film formed on the semiconductor substrate is several microns in thickness, the multilayer film, after having been peeled from the semiconductor substrate, is mechanically weak in strength, in many cases it is often damaged during adherence operations onto a transparent substrate. Therefore, this has brought about a problem in reduced production yields. Moreover, in order to handle such a thin layer, special equipment and tools are required, hence resulting in a problem of increasing production costs.

Consequently, this invention is accomplished in light of such situation, and the object of the present invention is to provide a method for manufacturing a semiconductor photodetector having high light detection sensitivity and capable of responding to high speed optical communications with improved productivity.

Consequently, the method for manufacturing the semiconductor photodetector in accordance with the present invention comprises a light absorption layer where electrons and holes are excited by absorption of the incident light, and is characterized in that (1) a multilayer film containing a light absorption layer is formed on a semiconductor substrate, (2) the semiconductor substrate, on which the multilayer film is formed, is adhered onto a transparent substrate so that an upper surface film of the multilayer film may come into contact with one plane of the transparent substrate which consists of a material transparent to incident light, (3) the semiconductor substrate adhered onto the transparent substrate, or the semiconductor substrate and some layers of the multilayer film are removed so that at least the light absorption layer may remain on the transparent substrate, (4) two electrodes which are mutually apart are formed on the multilayer film which remains on the transparent substrate.

In the semiconductor photodetector manufactured by such a manufacturing method, by allowing the light to enter from the side of the transparent substrate, the light can reach the light absorption layer without being shielded or absorbed by the electrode provided on the plane opposite to the transparent substrate of the light absorption layer. Thereby, the light detection sensitivity of the semiconductor photodetector can be improved.

Moreover, since the semiconductor substrate and some films of the multilayer film are removed after adhering to the semiconductor substrate, on which the multilayer film has been formed and the transparent substrate, the multilayer film remaining on the transparent substrate may be mechanically protected by this transparent substrate. The multilayer film therefore is not damaged during fabrication and the semiconductor photodetector can be manufactured at a high yield.

Moreover, it is characterized in that when forming the multilayer film, an etch stop layer consisting of a material different from that of the light absorption layer is formed between the light absorption layer and the semiconductor substrate, so as to be contained in the multilayer film, when removing the semiconductor substrate adhered to the transparent substrate, or the semiconductor substrate and some layers of the multilayer film, the etch stop layer is removed after removing the semiconductor substrate and some layers of the multilayer film between the semiconductor substrate and the etch stop layer.

Accordingly, the semiconductor substrate, and some layers of the multilayer film between the semiconductor substrate and the etch stop layer can be removed, and then only an etch stop layer can be removed by properly selecting and using an etchant which can etch the semiconductor substrate and some layers of the multilayer film between the semiconductor substrate and the etch stop layer but cannot etch the etch stop layer, and an etchant which can etch the etch stop layer but cannot etch the light absorption layer. The semiconductor substrate and some films of the multilayer film are therefore easily and reliably removed while the light absorption layer remains.

Furthermore, it is preferable that the transparent substrate consists of borosilicate glass, and the upper surface film of the multilayer film consists of silicon oxides, and the semiconductor substrate on which the multilayer film is formed is fusion-bonded to the transparent substrate so that the uppermost surface layer of the multilayer film and one plane of the transparent substrate may come into contact with each other.

Thereby, the semiconductor substrate on which the multilayer film is formed and the transparent substrate can be adhered without using adhesives etc. The light made incident from the side of the transparent substrate may therefore reach the light absorption layer without being absorbed by the adhesives.

BEST MODES FOR CARRYING OUT THE INVENTION

Hereafter, referring to the accompanying drawing, a description will be made of preferred embodiments of a method for manufacturing a semiconductor photodetector in accordance with the present invention. In addition, in the following discussion hereinafter, the same elements will be given the same reference numerals, and overlapping explanation will be omitted.

Moreover, in the drawings, the ratio of dimensions including the ratio of layer thickness of each epitaxial layer grown on a GaAs substrate is not necessarily in agreement with the description.

FIGS. 1A, 1B, 1C, 1D, and 1E are schematic block diagrams showing the steps of manufacturing an MSM-PD, and cross sections of the MSM-PD after each process is completed in accordance with a manufacturing method of the preferred embodiment. This manufacturing method can be divided into a crystal growth process, a CVD process, an adhering process, an etching process, and an electrode formation process, and these processes are sequentially performed.

(1) Crystal Growth Process

Figure 1A:
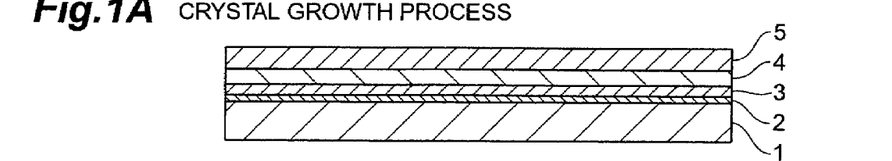
FIGS. 1A, 1B, 1C, 1D, and 1E are schematic block diagrams showing steps of manufacturing an MSM-PD, and cross sections of the MSM-PD after each process is completed in accordance with a manufacturing method described in the preferred embodiment.

First, a buffer layer 2 (GaAs), an etch stop layer 3 ($Al_xGa_{1-x}As$), a light absorption layer 4 (GaAs), and a window layer 5 ($Al_xGa_{1-x}As$) are sequentially epitaxially grown on a GaAs substrate 1 using metal organic chemical vapor deposition (hereinafter referred to as MOCVD) equipment.

The preferred film thickness of each layer 2–5 is as follows: buffer layer 2 is approximately 0.5 µm; etch stop layer 3, approximately 1 µm; light absorption layer 4, approximately 2 µm; and window layer 5, approximately 10 µm.

It is preferable that an Al composition ratio x for etch stop layer 3 is 0.5 or more. The reason is that it is difficult to etch this $Al_{0.5}Ga_{0.5}As$ with the etchant used when etching the GaAs which will be described later. Moreover, it is preferable that an Al composition ratio x for the window layer 5 is 0.3 or more.

If the light with a wavelength of 850 µm or more is optically detected, the Al composition ratio x may just be 0.04, but for a more preferable window layer 5, an Al composition ratio x of 0.3 or higher is more preferable. However, the Al composition ratio x of the window layer 5 may be properly determined by the wavelength of the light which is optically detected, for example, if the light with a short wavelength of 650 µm is optically detected, the Al composition ratio x must be 0.4 or more.

(2) CVD Process

Figure 1B:
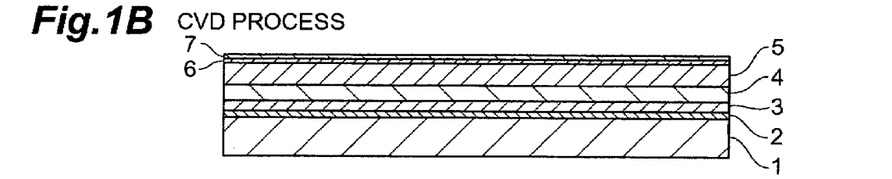

Next, an antireflection film 6 (SiNx) and an uppermost surface film 7 ($SiO_2$) are formed on the above-mentioned window layer 5 using a plasma CVD thin film deposition device.

Here, although a description will be made of an example using the plasma CVD, the present invention is not limited to this, if the desired antireflection film and the desired uppermost surface film can be deposited, for example, a thermal CVD method, a sputtering method, or the like can be used.

It is preferable that the film thickness of the antireflection film 6 is approximately 0.1 µm and the film thickness of the uppermost surface film 7 is 0.1–0.2 µm. The antireflection film 6 having a film thickness of 0.1 µm is preferable thickness for effectively passing incident light with a wavelength of 850 nm, specifically, it is desirable to correspond to λ/4n (λ: wavelength of incident light, n: refraction index of the antireflection film 6).

According to the above (1) crystal growth process and (2) CVD process, the multilayer film containing the light absorption layer 4 is formed on the GaAs substrate 1.

Incidentally, not only the GaAs substrate 1 but also the GaAs substrate formed after each layer is formed are substrates (of a semiconductor).

That is, the multilayer film has a following layer structure. More specifically, each numerical value may include an error of 10%.

TABLE 1

| Each Layer | Material | Composition | Thickness |
|---|---|---|---|
| Uppermost surface film 7: | SiO$_2$ | — | 0.1–0.2 µm |
| Antireflection film 6: | SiNx | — | 0.1 µm |
| Window layer 5: | AlxGa1-xAs | X ≧ 0.3 | 1 µm |
| Light absorption layer 4: | GaAs | — | 2 µm |
| Etch stop layer 3: | AlxGa1-xAs | x ≧ 0.5 | 1 µm |
| Buffer layer 2: | GaAs | — | 0.5 µm |
| Substrate 1: | GaAs | — | 350 µm |

(3) Adhering Process

Figure 1C:
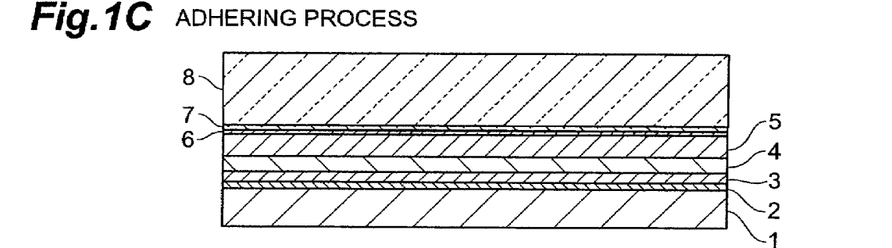

The GaAs substrate 1 on which the above-mentioned multilayer films 2 to 7 are laminated, and a glass substrate 8 are fusion-bonded. First, the surface of the glass substrate 8 is cleaned. Next, the glass substrate 8 and the GaAs substrate 1 are superposed so that this cleaned surface and the uppermost surface film 7 may come into contact with each other. Pressurizing and heating both substrates 1 and 8 in their superposed state would cause them to adhere by fusion-bonding.

Specifically, the pressure applied between the superposed glass substrate 8 and the GaAs substrate 1 is approximately 100 kPa, and the preferred heating temperature is 500–700° C. Since the uppermost surface film 7 on the GaAs substrate 1 consists of SiO$_2$, pressurization and heating under such conditions would cause fusion-bonding of the uppermost surface film 7 and the surface of the glass substrate 8, and adhering of the GaAs substrate 1 and the glass substrate 8.

In addition, in performing this adhering process, it is desirable that not only the surface of the glass substrate 8 but also the uppermost surface film 7 on the GaAs substrate 1 are clean. For that purpose, it is preferable to perform fusion-bonding operation or the like immediately after, for example, taking out the GaAs substrate 1 from the plasma CVD device which has formed the uppermost surface film 7.

Moreover, it is preferable to use No. 7056 by Corning Inc. or an equivalent glass substrate, as the glass substrate 8. The reason is that the thermal expansion coefficient of this glass substrate 8 is almost equal to the thermal expansion coefficient of the GaAs. Thereby, during the cooling process after heating, the stress generated between the GaAs substrate 1 and the glass substrate 8 based on the difference in their thermal expansion coefficients, can be reduced as much as possible, and the deterioration of the adhesion strength resulting from stress and introduction of a crystal defect can be suppressed to the maximum extent. However, as a glass substrate, it is not absolutely limited to 7056 glass, and if a thermal expansion coefficient is close to GaAs, it is possible to use any glass substrate without impairing its characteristics.

(4) Etching Process

Figure 1D:
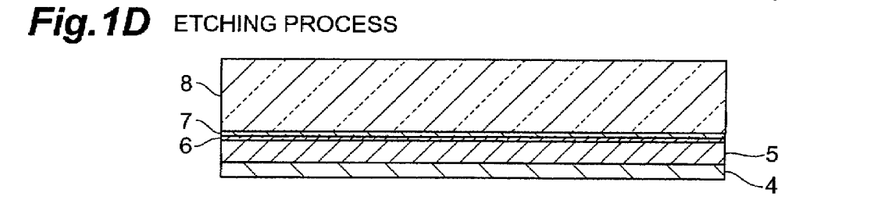

After the glass substrate 8 is adhered to the GaAs substrate 1, the back surface of the GaAs substrate 1, that is, the opposite side of the glass substrate 8 is exposed to the outside. In the etching process, the GaAs substrate 1, the buffer layer 2, and the etch stop layer 3 are removed from the back side of the GaAs substrate 1 by etching.

First, the GaAs substrate 1 and the buffer layer 2 can be etched, and the GaAs substrate 1 and the buffer layer 2 are removed with an etchant having a slow etching rate with respect to the etch stop layer 3. Continuously, the etch stop layer 3 can be etched, and the etch stop layer 3 is removed with an etchant having a slow etching rate with respect to the light absorption layer 4. Thereby, the glass substrate 8, on which the light absorption layer 4 and the window layer 5 and the like are laminated, is obtained.

As an etchant for actual use, a mixed solution (NH$_4$OH:H$_2$O$_2$=1:5) consisting of aqueous ammonia (NH$_4$OH) and hydrogen peroxide (H$_2$O$_2$), and a hydrochloric acid (HCl) solution are preferable. That is, the glass substrate 8 and the GaAs substrate 1, which are adhered together, are immersed first in the mixed solution of NH$_4$OH and H$_2$O$_2$. Thereby, the etching of the GaAs substrate 1 will be initiated from the back side.

As etching proceeds and the GaAs substrate 1 is removed completely, the etching of the buffer layer 2 (GaAs), which has been grown on the GaAs substrate 1, will subsequently be initiated. Subsequently, as the etching proceeds further, the buffer layer 2 will be removed and the etch stop layer 3 will be exposed to the etchant. Since the etch stop layer 3 (Al$_{0.5}$Ga$_{0.5}$As) has an extremely slow etching rate with respect to the etchant used here, the etching is automatically stopped when the etch stop layer 3 is exposed to the etchant. Thus, the GaAs substrate 1 and the buffer layer 2 are removed first.

Subsequently, the glass substrate 8, on which layers 3 to 5 and films 6 and 7 remain, are drawn from the mixed solution of NH$_4$OH and H$_2$O$_2$, washed and dried, and then immersed in a hydrochloric acid (HCl) solution. At this time, it is preferable that the HCl solution is heated at a temperature of 50° C. in advance in order to accelerate the etching rate. Since GaAs is hardly etched with the HCl solution, only the etch stop layer 3 (Al$_{0.5}$Ga$_{0.5}$As) is etched this time, and when the light absorption layer 4 (GaAs) is exposed to the etchant, the etching is stopped automatically. Thus, the etch stop layer 3 is removed. In addition, hydrofluoric acid (HF) solution may also be used instead of the HCl solution.

(5) Electrode Formation Process

Figure 1E:
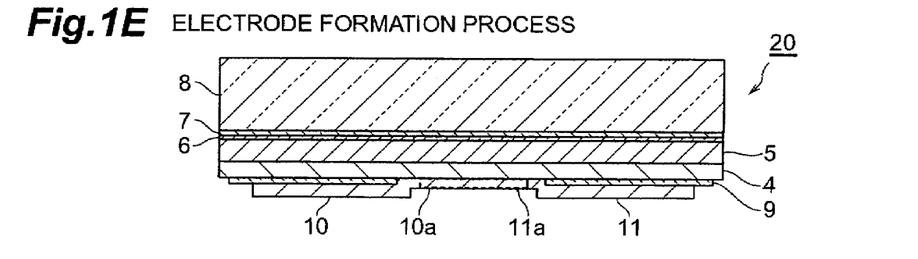

Next, Schottky electrodes 10 and 11 are formed on the light absorption layer 4. That is, an insulating film 9 is first deposited on the light absorption layer 4 using the plasma CVD device. Subsequently, according to the normal pattern formation method using a lithography method, an opening having the shape of Schottky electrodes 10 and 11 is formed in the insulating film 9. The Schottky electrodes 10 and 11 are then formed in this opening according to a vacuum deposition method or the like.

Specifically, the insulating film 9 is formed using the same deposition method as used for deposition of antireflection film 6 formed using the CVD process, that is, the CVD method which uses SiH$_4$ and NH$_3$ as materials may be employed. Next, a resist film is coated on the insulating film 9, and using a method for the normal pattern formation method based on the photolithography and the etching, the portions of the insulating film 9 where the Schottky electrodes 10 and 11 are formed, is removed, and using vacuum vapor deposition, titanium (Ti)/platinum (Pt)/gold (Au) having a predetermined film thickness are vapor-deposited, and then the Schottky electrodes 10 and 11 having the comb-portions 10a and 11a, and the pad portions 10b and 11b, which will be explained later, are formed in the portions where the above-mentioned insulating film 9 is removed.

Since two or more sets of Schottky electrodes 10 and 11 corresponding to a plurality of MSM-PDs 20 are formed on the light absorption layer 4, a chipped MSM-PD 20 is obtained by dicing the glass substrate 8, on which the light absorption layer 4 etc., are laminated, corresponding to the element shape of each MSM-PD 20.

As described above, in accordance with the manufacturing method of this embodiment, since after forming the multilayer films 2 to 7 on the GaAs substrate 1, the GaAs substrate 1 is fusion-bonded to the glass substrate 8, and the GaAs substrate 1 is removed, the light absorption layer 4 and the window layer 5, etc., may be mechanically protected by the glass substrate 8 after the removal of the GaAs substrate and the like. For this reason, the light absorption layer 4 and the window layer 5 are not damaged. The MSM-PD 20 therefore can be manufactured with excellent productivity.

The operation as well as the configuration of the MSM-PD 20 manufactured as described above will now be explained, here.

Figure 2A:
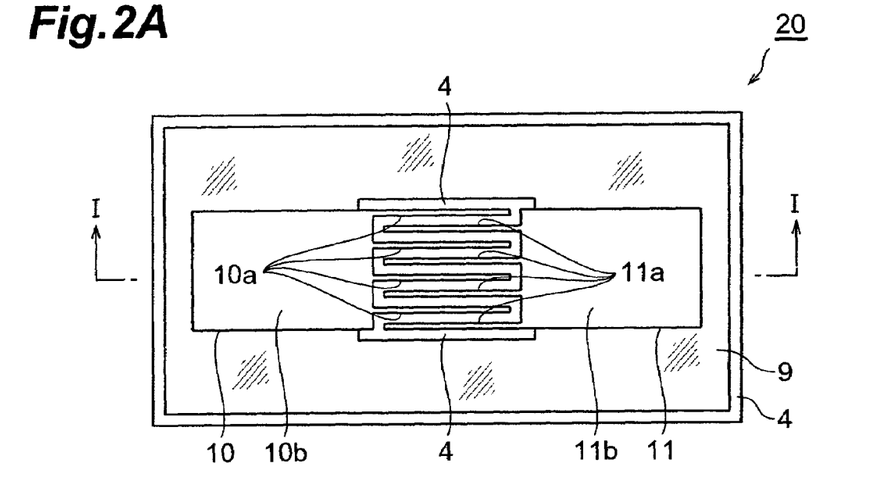
FIG. 2A is a plan view of the MSM-PD manufactured in accordance with the manufacturing method of the preferred embodiment as viewed from the side of Schottky electrodes 10 and 11.
Figure 2B:
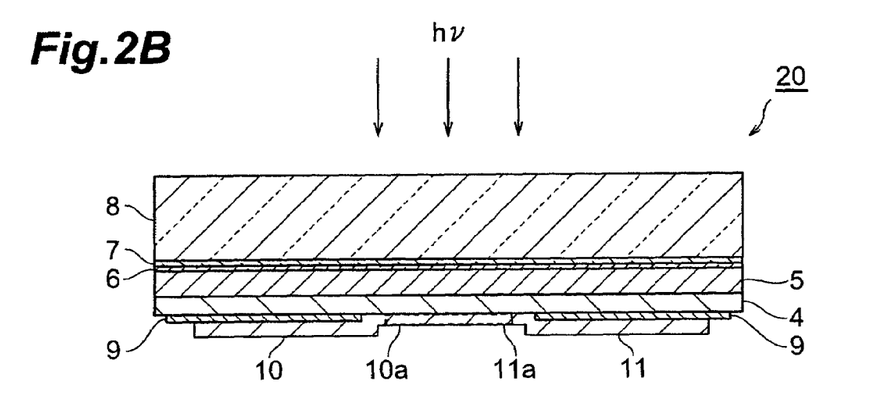
FIG. 2B is a sectional drawing taken along line I—I of the plan view in FIG. 2A.

FIG. 2A is a plan view of the MSM-PD 20 manufactured in accordance with a manufacturing method of the preferred embodiment viewed from the side of the Schottky electrode 10 and 11. FIG. 2B is a sectional drawing taken on line I—I of the plan view in FIG. 2A.

As shown in FIG. 2B, the MSM-PD 20 comprises the glass substrate 8 for allowing light to enter, the uppermost surface film 7 to be used as a plane for adhering the glass substrate 8 with the GaAs substrate 1, the antireflection film 6 for efficiently passing the light entering from the glass substrate 8, and the light absorption layer 4 for absorbing the light that enters, and for exciting electron-hole pairs therein by this absorption.

Further, the MSM-PD 20 comprises the insulating film 9 so as to come into contact with the light absorption layer 4, and Schottky electrodes 10 and 11 which come into contact with the light absorption layer 4 in the opening of the insulating film 9. Here, the Schottky electrodes 10 and 11 have comb-portions 10a and 11a formed in a comb-tooth shape which are alternately arranged with each other and pad portions 10b and 11b as shown in FIG. 2A.

In the portions of the light absorption layer 4 to come into contact with the Schottky electrodes 10 and 11, the Schottky junction is formed, and the MSM structure is provided with the comb-portion 10a, the light absorption layer 4 (GaAs), and the comb-portion 11a.

When the MSM-PD 20 actually detects the light optically, a power supply (not shown) is connected to the Schottky electrodes 10 and 11, and a voltage is applied between electrodes 10 and 11. In this state, as shown in FIG. 2B, light hv is made incident from the side of the glass substrate 8.

The light hv mentioned here is the light which is emitted from optical fibers forming, for example, the optical LAN system. The incident light hv sequentially passes through the glass substrate 8, the uppermost surface film 7, the antireflection film 6, and the window layer 5, and reaches the light absorption layer 4. In the light absorption layer 4, this light hv is absorbed and the electron-hole pairs are excited. The excited electrons and holes are drifted toward electrodes 10 and 11 (comb-portions 10a and 11a) which have opposite polarities, respectively, by the electric field formed by the voltage applied to the Schottky electrodes 10 and 11.

Then, when the electrons and the holes reach each comb-portions 10a and 11a, they are outputted outside as a current through the comb-portions 10a and 11a, and the pad portions 10b and 11b. Since the number of the electron-hole pairs excited within the light absorption layer 4 varies depending on the intensity of the incident light hv, the current value of the current outputted from the electrodes 10 and 11 also varies. As a result, by changing the intensity of light hv, the carried light signals are converted into electrical signals.

As described above, in the MSM-PD 20, the light is made incident from the side of the glass substrate 8, sequentially passes through the uppermost surface film 7, the antireflection film 6, and the window layer 5, which do not absorb the light, and can reach the light absorption layer 4. Accordingly, the problem where the light is shielded or absorbed by the electrode when the light is made incident from the side of the electrode, no longer occurs. Therefore, there is no deterioration of the light detection sensitivity in the MSM-PD 20.

A description will be made of a preferable light detecting device formed using the MSM-PD 20 explained above, suitable for application to the optical transmission system etc., hereinafter.

Figure 3:
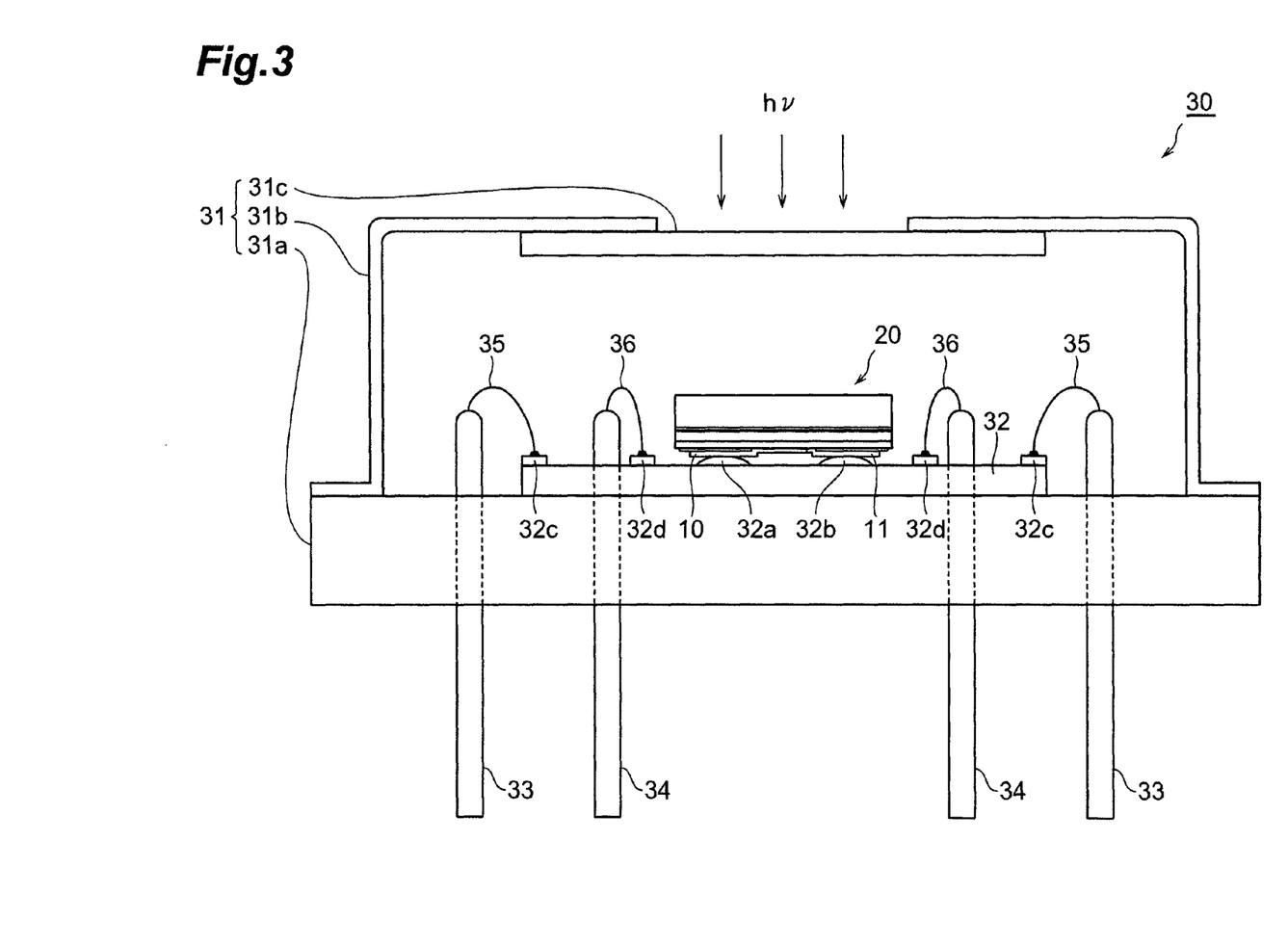
FIG. 3 is a schematic block diagram showing a light detecting device in which the MSM-PD is embedded in a package 31.

FIG. 3 is a schematic block diagram showing a light detecting device 30 in which the MSM-PD 20 is embedded in a package 31. This package 31 comprises three components, in which an inert gas, such as nitrogen, is enclosed, and are individually hermetically sealed, i.e., a metallic lower package 31a, a metallic upper package 31b, and a glass window portion 31c. A preamplifier chip 32 for processing the electrical signals which are outputted from the MSM-PD 20 is arranged on the upper surface of the lower package 31a (surface facing the package 30b).

In the preamplifier chip 32, as shown in FIG. 3, bump electrodes 32a and 32b for electrically connecting the preamplifier chip 32 and the MSM-PD 20 are formed on the surface opposite to that into contact with the lower package 31a. These bump electrodes 32a and 32b are arranged at spacing equal to the spacing of the pad portions 10b and 11b on the Schottky electrodes 10 and 11 of the MSM-PD 20, respectively. The MSM-PD 20 is then mounted and arranged on the preamplifier chip 32 so that the bump electrodes 32a and 32b are into contact with the pad portions 10b and 11b, respectively, and are electrically connected to each other.

Moreover, on the upper portion of the preamplifier chip 32, arranged are an electrode 32c for connecting the power supply (not shown) for supplying power to the preamplifier chip 32, and an electrode 32d for outputting the electrical signals processed in the preamplifier chip 32 to an external circuit (not shown). Furthermore, these electrodes 32c and 32d are connected to terminals 33 and 34 provided to the lower package 31a through gold wires 35 and 36.

In the light detecting device 30 formed as above, as shown in FIG. 3, since the glass substrate 8 for forming the MSM-PD 20 is arranged so as to oppose the window portion 31c, the light that passes through the window portion 31c is made incident into the light absorption layer 4 through the glass substrate 8. The electrical signals generated by the incidence of this light is then inputted into the preamplifier chip 32 through the bump electrodes 32a and 32b from the pad portions 10b and 11b. The electrical signals that have been processed by the preamplifier chip 32 are then outputted to the external circuit arranged outside of the light detecting device 30. The processing performed by the preamplifier chip 32 is a pre-stage amplification etc., and thereby, the signals in the external circuit may easily be processed.

In addition, the embodiment and the method of the wiring or the connection between the MSM chips, the preamplifier chips, and the terminals shown here are exemplarily illustrated to explain these items, and the actual wiring and the connection are made depending on each case. Of course, it may be configured by a single MSM chip without including the preamplifier chip.

Figure 4A:
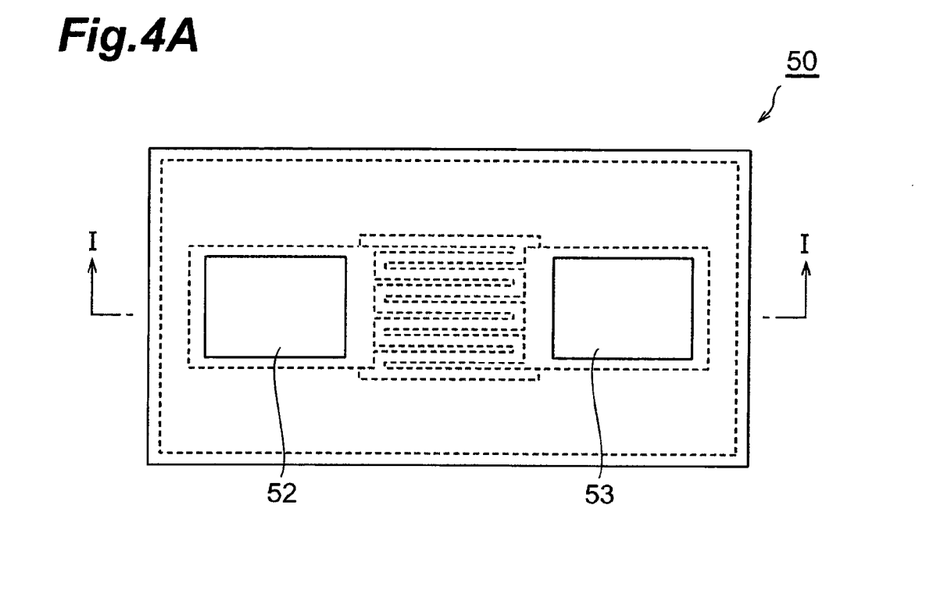
FIG. 4A is a plan view of a photodetector formed using the MSM-PD as viewed from a side of an electrode.
Figure 4B:
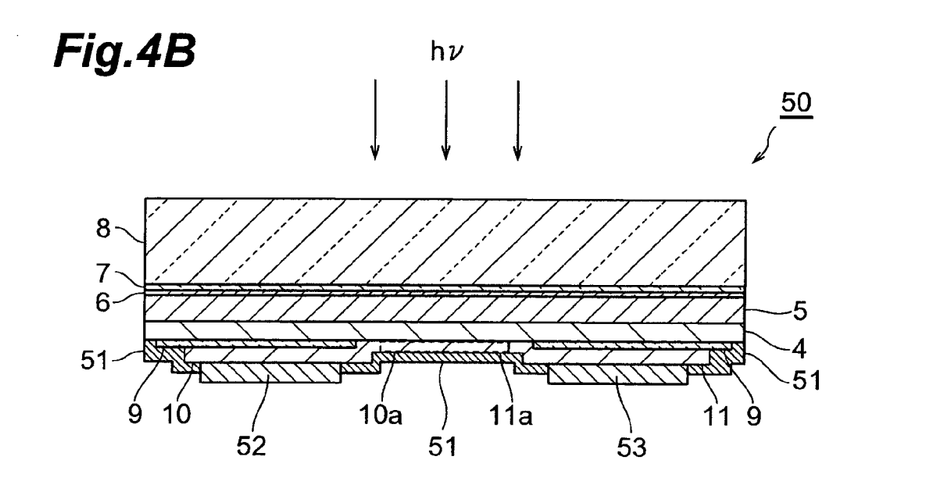
FIG. 4B is a sectional drawing taken along line I—I of the plan view as shown in FIG. 4A.

Next, a description will be made of other examples of the light detecting device formed using the MSM-PD 20. FIG. 4A is a plan view of the photodetector formed using the MSM-PD 20 as viewed from the side of the electrode. FIG. 4B is a sectional drawing taken along line I—I of the plan view in FIG. 4A.

As shown in FIG. 4B, a photodetector 50 provides the pad portions 10b and 11b of the Schottky electrodes 10 and 11 with the gold electrodes 52 and 53. Moreover, the photodetector 50 has the Schottky electrodes 10 and 11, the insulating film 9, and an insulating protective film 51 consisting of SiN or SiO$_2$ arranged so as to cover the light absorption layer 4 and expose the gold electrodes 52 and 53.

Such a composition is fabricated as follows.

After the Schottky electrodes 10 and 11 are formed in the (4) electrode formation process as mentioned above (before dicing), the insulating protective film 51 with a thickness of approximately 0.5 μm is formed on the surface where the Schottky electrodes 10 and 11 are formed using plasma CVD equipment. Next, the SiN film or SiO$_2$ film is removed by photolithography and etching in order to expose a part of the pad portions 10b and 11b of the Schottky electrodes 10 and 11.

Next, a gold (Au) thin film is formed in the exposed pad portions 10b and 11b by vacuum deposition. Subsequently, gold electrolytic plating is performed to selectively form the gold electrodes 52 and 53 in the pad portions 10b and 11b. Subsequently, the photo detector 50 is obtained by dicing the substrate into chips. Solder materials, such as lead (Pb)-tin (Sn) etc., may further be coated on the surface of the gold electrodes 52 and 53.

Thus, the photodetector 50 has the composition wherein the gold electrodes 52 and 53 are exposed while the glass substrate 8 is the light incident portion and the opposite surface opposite to the light incident portion is coated with the insulating protective film 51. Accordingly, the photodetector 50 can be treated as a single part similar to a circuit element or an electronic part, such as a general-purpose chip resistor or a chip capacitor. Moreover, for example, when the MSM-PD 20 is mounted in combination with Hybrid ICs, there is also an advantage in that the mounting operation can be done easily.

In the above-mentioned embodiment, although the case where the MSM-PD 20 having the light absorption layer 4 consisting of GaAs is manufactured is described, the present invention is not limited to this and various modifications are available.

For example, the GaAs substrate 1 may be etched utilizing a dry etching technique using a plasma etching system or the like. In this case, it is desirable to stop etching at the time when the light absorption layer 4 is exposed, using the end point detecting method usually used in a dry etching technique.

Moreover, by using a method similar to the epitaxial lift-off method, the GaAs substrate 1 may be removed. That is, although Al$_{0.5}$Ga$_{0.5}$As, whose Al composition ratio x is 0.5, is formed as the etch stop layer 3 in the above-mentioned embodiment, an AlAs layer is formed instead of this. The GaAs substrate 1 on which the multilayer film (layer 2, AlAs layer, layers 4 and 5, and films 6 and 7) is formed, is then adhered to the glass substrate 8 so that the uppermost surface film of the multilayer film and the glass substrate 8 may contact each other.

Then, when both substrates 1 and 8, which have been adhered to each other, are immersed in the hydrofluoric acid (HF) solution after forming the protective film etc., for protecting the glass substrate 8 from the etchant, since the AlAs is selectively and quickly etched by the hydrofluoric acid (HF), the GaAs substrate 1 and the buffer layer 2 are separated from the light absorption layer 4 and the window layer 5. As a result, the glass substrate 8 on which the light absorption layer 4 and the window layer 5, etc., are formed is obtained. Even when the GaAs substrate 1, etc., are removed using such a method, the light absorption layer 4 and the window layer 5 etc., can be mechanically protected because of their being adhered to the glass substrate 8.

Furthermore, when the GaAs substrate 1, on which the multilayer films 1–7 are formed, is adhered to the glass substrate 8, as long as the adhesive etc., are used, which do not absorb the incident light, both substrates 1 and 8 may be adhered using such adhesive etc.

Still further, in accordance with the above-mentioned embodiment, although the light absorption layer 4 is grown following the etch stop layer 3 in the (1) crystal growth process, for example, the light absorption layer 4 may be grown on this layer after the other layer is grown on the etch stop layer 3. This layer may be a so-called Schottky enhancement layer or the like, such as Al$_x$Ga$_{1-x}$As (x=0.1–0.5) etc., which adjusts appropriately the curve of the energy band of the light absorption layer 4 (GaAs) near the interface between the electrodes 10 and 11 and the light absorption layer 4 to facilitate the drift of the electrons and the holes effectively.

Moreover, when using such a layer and removing the GaAs substrate 1 etc., by etching, a structural contrivance for selectively etching each layer, such as forming the GaAs layer between the etch stop layer 3 and this layer, are inevitably required.

Still further, the semiconductor photodetector manufactured in accordance with the method for manufacturing the semiconductor photodetector of the present invention is not limited to the photodetector used for a near-infrared region manufactured using the GaAs substrate in the above-mentioned embodiment, but can be applied to all other semiconductor photodetectors manufactured using the above-mentioned manufacturing method. For example, even a photodetector having sensitivity in the infrared region manufactured using an InP substrate may be manufactured based on the method for manufacturing the semiconductor photodetector in accordance with the present invention, as needed. Moreover, for a photodetector which has sensitivity with respect to the visible light region, a photodetector having a light absorption layer consisting of AlGaInP and manufactured using the GaAs substrate may also be preferably manufactured using the manufacturing method according to the present invention.

Still further, although only the MOCVD method is explained for the crystal growth process of the preferred embodiment, the scope of this invention is not limited to this method, but is available for carrying out all semiconductor crystal growth methods, such as VPE (vapor phase epitaxy), MBE (molecular beam epitaxy), MOMBE (metal-organic molecular beam epitaxy), CBE (chemical beam epitaxy), LPE (liquid phase epitaxial) or the like.

INDUSTRIAL APPLICABILITY

The present invention is applicable to the method for manufacturing the semiconductor photodetector.

The invention claimed is:

1. A method for manufacturing a semiconductor photodetector including a light absorption layer in which electrons and holes are excited by absorption of incident light, the method comprising:

forming a multilayer film including said light absorption layer on a substrate, adhering said substrate on which said multilayer film is formed and a transparent substrate so that an uppermost surface film of said multilayer film may come into contact with one surface of said transparent substrate formed of a material transparent to the incident light, and removing said substrate adhered to said transparent substrate, or said substrate and some layers of said multilayer film so that at least said light absorption layer may remain on said transparent substrate, and forming two electrodes which are mutually apart on said multilayer film which remains on said transparent substrate.

2. The method for manufacturing a semiconductor photodetector according to claim 1, further comprising:

forming an etch stop layer between said light absorption layer and said substrate, and formed of a material different from said light absorption layer so as to be contained in said multilayer film when forming said multilayer film, and removing said etch stop layer when removing said substrate adhered to said transparent substrate, or said substrate and some layers of said multilayer film, after removing said substrate, and some layers of said multilayer film between said substrate and said etch stop layer.

3. The method for manufacturing the semiconductor photodetector according to claim 1, wherein said transparent substrate is formed of borosilicate glass, and the uppermost surface film of said multilayer film is formed of silicon oxides, and the method further comprising: fusion-bonding said substrate on which said multilayer film is formed and said transparent substrate so that the upper surface layer of said multilayer film and one surface of said transparent substrate may come into contact with each other.

* * * * *